(12) United States Patent
Chang et al.

(10) Patent No.: US 9,678,422 B2
(45) Date of Patent: Jun. 13, 2017

(54) PHOTOACID GENERATOR BOUND TO FLOATING ADDITIVE POLYMER

(71) Applicant: Taiwan Semiconductor Manufacturing Company, Ltd., Hsin-Chu (TW)

(72) Inventors: Ching-Yu Chang, Yilang County (TW); Chen-Yu Liu, Kaohsiung (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 14/869,400

(22) Filed: Sep. 29, 2015

(65) Prior Publication Data
US 2016/0093493 A1 Mar. 31, 2016

Related U.S. Application Data

(60) Provisional application No. 62/057,594, filed on Sep. 30, 2014.

(51) Int. Cl.
| | |
|---|---|
| *H01L 21/302* | (2006.01) |
| *G03F 7/004* | (2006.01) |
| *H01L 21/027* | (2006.01) |
| *H01L 21/308* | (2006.01) |
| *G03F 7/038* | (2006.01) |
| *G03F 7/039* | (2006.01) |
| *G03F 7/095* | (2006.01) |

(52) U.S. Cl.
CPC ............ *G03F 7/004* (2013.01); *G03F 7/0045* (2013.01); *G03F 7/0046* (2013.01); *G03F 7/0382* (2013.01); *G03F 7/0392* (2013.01); *G03F 7/095* (2013.01); *H01L 21/0271* (2013.01); *H01L 21/3081* (2013.01)

(58) Field of Classification Search
CPC ............. H01L 21/0332; H01L 21/0335; H01L 21/0337; H01L 21/0338; H01L 21/0276; G03F 7/004; G03F 7/11
USPC ........ 438/717, 725, 736, 703; 430/312, 313, 430/322, 325
See application file for complete search history.

(56) References Cited

U.S. PATENT DOCUMENTS

| | | | |
|---|---|---|---|
| 8,216,767 B2 | 7/2012 | Wang et al. | |
| 8,323,868 B2 * | 12/2012 | Cheng | G03F 7/0392 430/270.1 |
| 8,323,870 B2 | 12/2012 | Lee et al. | |
| 8,580,117 B2 | 11/2013 | Kao et al. | |
| 8,658,344 B2 | 2/2014 | Wang et al. | |
| 8,715,919 B2 | 5/2014 | Chang et al. | |
| 8,741,551 B2 | 6/2014 | Wu et al. | |
| 8,753,797 B2 | 6/2014 | Lin et al. | |
| 9,245,751 B2 * | 1/2016 | Su | G03F 7/40 |

(Continued)

*Primary Examiner* — Lan Vinh
(74) *Attorney, Agent, or Firm* — Haynes and Boone, LLP (57) ABSTRACT

Methods and materials for making a semiconductor device are described. The method includes providing a substrate, forming a middle layer comprising a floating additive polymer (FAP) at an upper surface of the middle layer, the FAP chemically bound to a photoacid generator (PAG) and including a fluorine-containing material over the substrate, forming a photoresist layer over the middle layer, exposing the photoresist layer and the middle layer to an exposure energy to produce acid bound to the middle layer in the exposed areas of the middle layer, and developing the photoresist layer.

20 Claims, 9 Drawing Sheets

(56) References Cited

U.S. PATENT DOCUMENTS

| | | | |
|---|---|---|---|
| 2003/0162120 A1* | 8/2003 | Yoon | G03F 7/0382 430/156 |
| 2013/0323641 A1 | 12/2013 | Chang | |
| 2014/0011133 A1 | 1/2014 | Liu et al. | |
| 2014/0017615 A1 | 1/2014 | Chang | |
| 2014/0017616 A1 | 1/2014 | Chang | |
| 2014/0065843 A1 | 3/2014 | Chang et al. | |
| 2014/0117563 A1 | 5/2014 | Yu et al. | |
| 2014/0120459 A1 | 5/2014 | Liu et al. | |
| 2014/0186773 A1 | 7/2014 | Chang | |
| 2014/0255850 A1 | 9/2014 | Chang et al. | |
| 2014/0272709 A1 | 9/2014 | Liu et al. | |
| 2014/0272726 A1 | 9/2014 | Chang | |
| 2014/0273521 A1 | 9/2014 | Wu et al. | |

\* cited by examiner

PHOTOACID GENERATOR BOUND TO FLOATING ADDITIVE POLYMER

CROSS-REFERENCE TO RELATED APPLICATIONS

This application claims priority to the filing date of U.S. Provisional Patent Application No. 62/057,594 filed Sep. 30, 2014, which is incorporated by reference in its entirety.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component that can be created using a fabrication process) has decreased. As lithographic features are reduced to below 40 nm, high numerical aperture processes are needed to overcome the resolution limit. The use of a trilayer films scheme appears to be promising in this regard.

In a trilayer films scheme, a photoacid generator (PAG) may be blended with components in a middle layer. When the middle layer is exposed to radiation, the PAG generates acid. Due to the porous nature of the middle layer, this acid can diffuse from the middle layer to a photoresist layer, which reduces resist contrast. Thus, a process and material that minimizes or removes these problems is desired.

BRIEF DESCRIPTION OF THE DRAWINGS

Aspects of the present disclosure are best understood from the following detailed description when read in association with the accompanying figures. It is noted that, in accordance with the standard practice in the industry, various features in the drawings are not drawn to scale. In fact, the dimensions of illustrated features may be arbitrarily increased or decreased for clarity of discussion.

DETAILED DESCRIPTION

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 1:
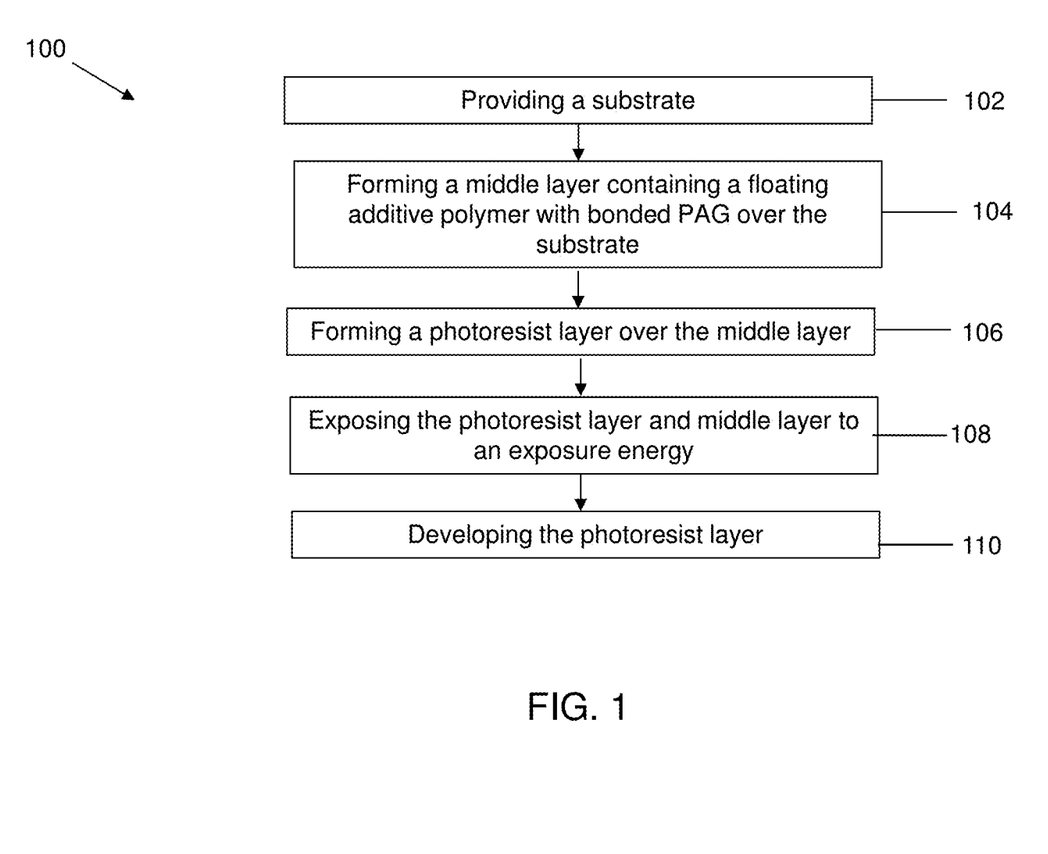
FIG. 1 is a flowchart of a method for making a semiconductor device in one embodiment according to various aspects of the present disclosure.
Figure 2:
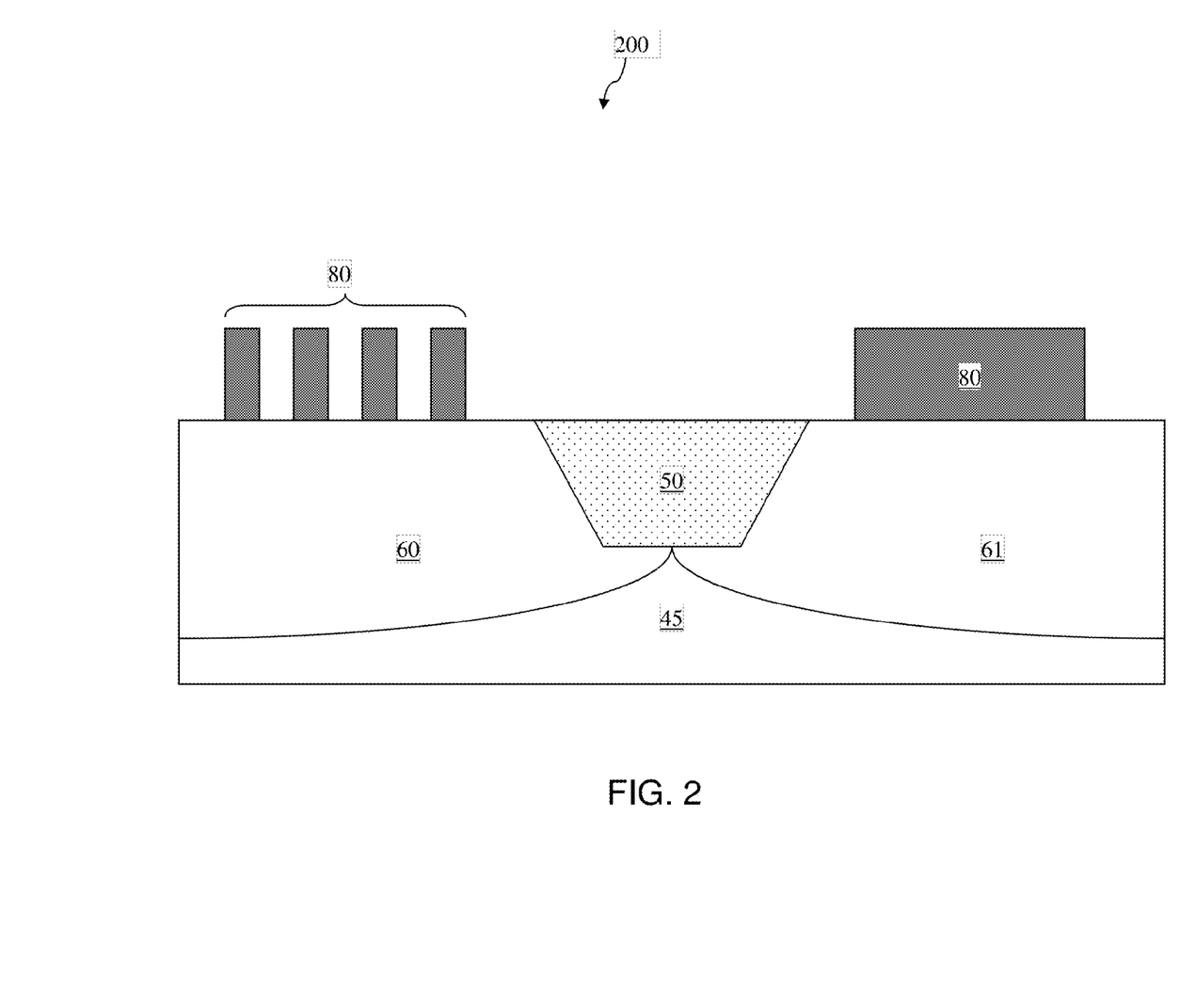
FIGS. 2 and 3 are diagrammatic fragmentary cross-sectional side views of a semiconductor substrate according to various aspects of the present disclosure.

FIG. 1 is a flowchart of one embodiment of a method 100 of making a semiconductor device 200 according to aspects of the present disclosure. The method 100 begins at step 102 by providing a semiconductor substrate. Referring to FIG. 2, the semiconductor device 200 may be a semiconductor Integrated Circuit (IC) chip, system on chip (SoC), or portion thereof, that may include memory circuits, logic circuits, high frequency circuits, image sensors, and various passive and active components such as resistors, capacitors, and inductors, P-channel field effect transistors (pFET), N-channel FET (nFET), metal-oxide semiconductor field effect transistors (MOSFET), or complementary metal-oxide semiconductor (CMOS) transistors, bipolar junction transistors (BJT), laterally diffused MOS (LDMOS) transistors, high power MOS transistors, or other types of transistors. It should be noted that some features of the semiconductor device 200 may be fabricated with a CMOS process flow.

The semiconductor device 200 includes a substrate 45. In the embodiment shown, the substrate 45 is a silicon substrate that is doped with a P-type dopant such as boron. In another embodiment, the substrate 45 is a silicon substrate that is doped with an N-type dopant such as arsenic or phosphorous. The substrate may alternatively be made of some other suitable elementary semiconductor material, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. Further, in some embodiments, the substrate 45 could include an epitaxial layer (epi layer), may be strained for performance enhancement, and may include a silicon-on-insulator (SOI) structure.

Isolation structures such as isolation structure 50 are formed in the substrate 45. The isolation structure 50 includes a shallow trench isolation (STI) device. The STI devices contain a dielectric material, which may be silicon oxide, silicon nitride, silicon oxy-nitride, fluoride-doped silicate (FSG), and/or a low-k dielectric material known in the art. The STI devices are formed by etching trenches in the substrate 45 and thereafter filling the trenches with the dielectric material. In other embodiments, deep trench isolation (DTI) devices may also be formed in place of (or in combination with) the STI devices as the isolation structures.

Doped wells such as doped wells 60 and 61 may also formed in the substrate 45. The doped wells 60-61 are formed on either side of the isolation structure 50. In some embodiments, the doped wells 60-61 are doped with an N-type dopant such as arsenic or phosphorous. In some other embodiments, the doped wells 60-61 may be doped with a P-type dopant. The doping may be carried out using an ion implantation process or a diffusion process known in the art.

One or more device patterns 80 are formed over the substrate 45. The device patterns 80 may be components of IC circuit devices, for example polysilicon or metal gates of MOS transistors or other suitable semiconductor features. The device patterns 80 may be formed by one or more deposition and patterning processes. The deposition processes may include chemical vapor deposition (CVD), physical vapor deposition (PVD), atomic layer deposition (ALD), or other suitable deposition processes. The patterning processes may include a lithography process involving one or more masking, exposing, baking, developing, and rinsing processes (not necessarily in that order). One or more of the device patterns 80 may need to undergo further patterning later to form IC circuit device components.

Figure 3:
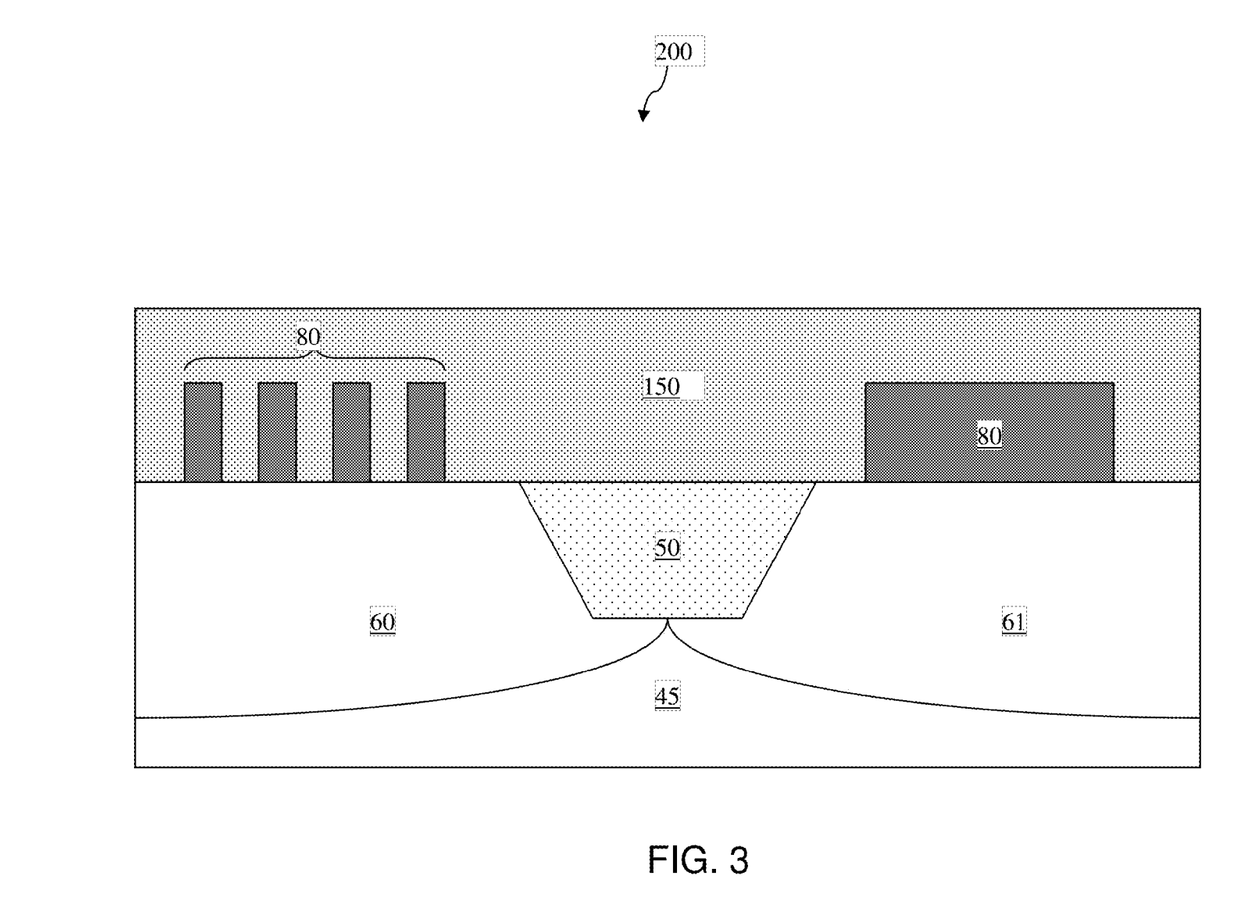

Referring now to FIG. 3, a layer 150 is formed over the substrate 45. The layer 150 is formed over and surrounds the device patterns 80. In some embodiments, the layer 150 may be formed by a spin coating process. In other embodiments, the layer 150 may be formed by another suitable deposition process. The layer 150 contains a material that is patternable. In some embodiments, the layer 150 contains an organic material. The organic material may include a plurality of monomers or polymers that are not cross-linked. As a result, the layer 150 is relatively soft.

Still referring to FIG. 3, to reduce the variations in wafer topography—in other words, to make the surface of the wafer flatter—an etching back process may be performed on the layer 150. In some embodiments, the etching back process may include a chemical-mechanical-polishing (CMP) process. The polishing process polishes away excess material at layer 150 to transform it into a flatter layer 150. The layer 150 has a substantially flat surface.

Figure 4:
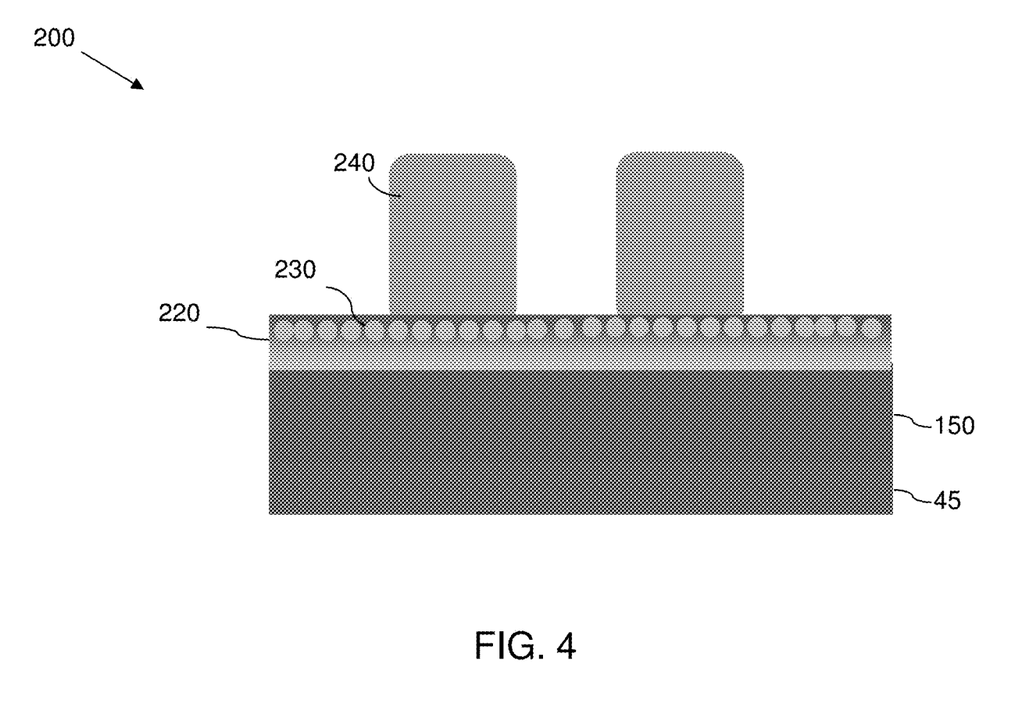
FIG. 4 is a sectional view of one embodiment of a semiconductor device constructed according to various aspects of the present disclosure.

Referring now to FIG. 4 and step 104, a middle layer 220 is formed on the substrate 45. The middle layer 220 includes a floating additive polymer (FAP) 230 that includes a fluorine-containing material. In some embodiments, the middle layer 220 includes less than about 30% by weight of the FAP 230. If the middle layer 220 includes more than 30% FAP, the etch rate of the middle layer can change. The FAP 230 "floats" or rises to the upper surface or portion of the middle layer 220. The fluorine-containing material in the FAP 230 has a low surface energy and tends to move to the upper surface of the middle layer 220. As illustrated in FIG. 4, the FAP 230 may be more concentrated at the top of the middle layer 220 compared to the lower portions of the middle layer 220. It is believed that the fluorine-containing material generates a thin, inner barrier layer in the middle layer 220 that minimizes possible interactions between the photoresist layer 240 and the middle layer 220.

In various embodiments, the concentration of the fluorine-containing material in the FAP 230 may be adjusted to change the hydrophobicity of the middle layer 220. That is, the greater the concentration of the fluorine-containing material in the middle layer 220, the more hydrophobic (oil-like) the middle layer 220. The fluorine-containing material in the FAP 230 has a low reactivity and makes the middle layer 220 more hydrophobic, thus increasing the contact angle of the middle layer 220. By including the fluorine-containing material in the middle layer 220, the contact angle mismatch between the photoresist layer 240 and the middle layer 220 is reduced. A more hydrophobic middle layer 220 improves adhesion of the middle layer 220 to the photoresist layer 240 to improve photoresist pattern peeling. Reduced pattern peeling translates to sharper and more distinct features in the semiconductor device 200. Moreover, the increased hydrophobicity of the middle layer 220 prevents hydrophilic developer solutions from penetrating the middle layer 220 and causing collapse of the photoresist pattern during development of the photoresist layer 240.

The FAP 230 also includes a PAG chemically bound to the FAP 230. When absorbing photo energy, the PAG forms a small amount of acid. Examples of suitable PAGs include halogenated triazines, onium salts, diazonium salts, aromatic diazonium salts, phosphonium salts, sulfonium salts, iodonium salts, imide sulfonate, oxime sulfonate, diazodisulfone, disulfone, o-nitrobenzylsulfonate, sulfonated esters, halogenerated sulfonyloxy dicarboximides, diazodisulfones, α-cyanooxyamine-sulfonates, imidesulfonates, ketodiazosulfones, sulfonyldiazoesters, 1,2-di(arylsulfonyl)hydrazines, nitrobenzyl esters, and s-triazine derivatives.

In various embodiments, the FAP 230 is cross-linked. In an exemplary embodiment, the FAP 230 includes a silicon-containing organic polymer. The middle layer 220 may also include a silicon-containing inorganic polymer. For example, the inorganic polymeric material may include silicon oxide. The middle layer 220 may further include a metal-containing organic polymer material that contains metal such as titanium, titanium nitride, aluminum, and tantalum. In another embodiment, the middle layer 220 may include silicon nitride or silicon oxynitride. The middle layer 220 may include pure silicon such as polycrystalline silicon or silicon oxide. For example, the middle layer 220 may include spin-on glass (SOG) known in the art. The middle layer 220 may be thermally baked for cross-linking, thus without further requiring a solvent. Many traditional fabrication processes may be used to form the middle layer 220.

Figure 5:
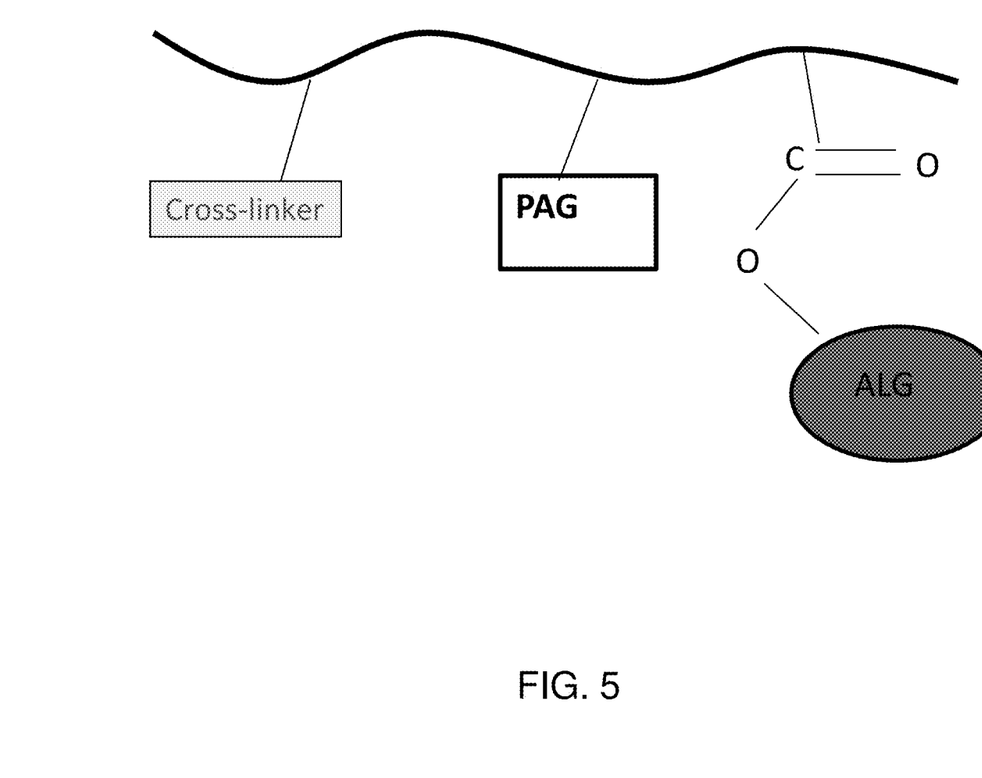
FIG. 5 illustrates a general structure of a floating additive polymer (FAP) according to various aspects of the present disclosure.

FIG. 5 provides an example structure of a suitable FAP 230. As shown, the FAP 230 include a cross-linker, a PAG group, and a polarity switchable group that includes an acid labile group (ALG), each chemically bound to the polymer backbone. In various embodiments, the carboxylic acid group may be replaced by a sulfonic acid group or other acid functional group.

Figures 6A, 6C:
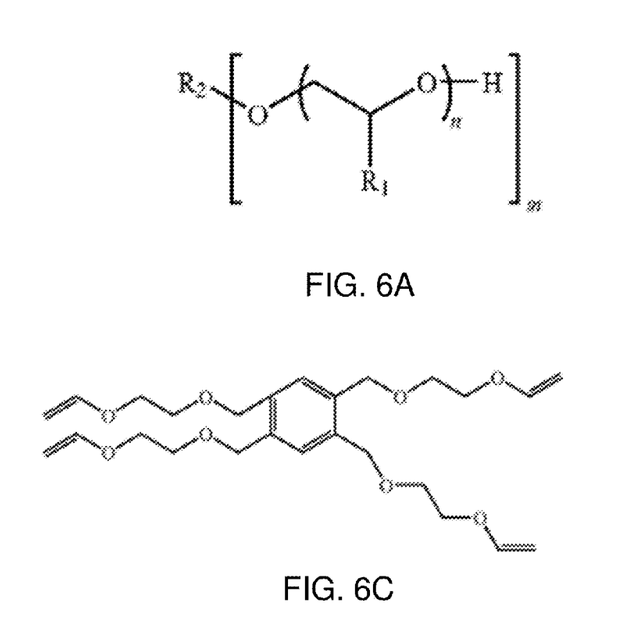
FIGS. 6A-6F illustrates examples of cross-linkers according to various aspects of the present disclosure.
Figure 6B:
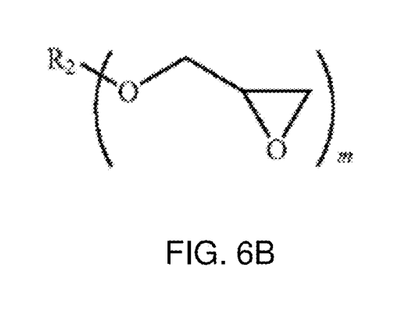
Figure 6D:
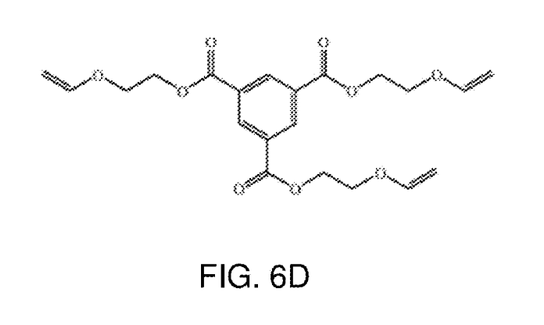
Figure 6E:
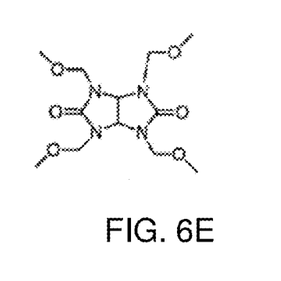
Figure 6F:
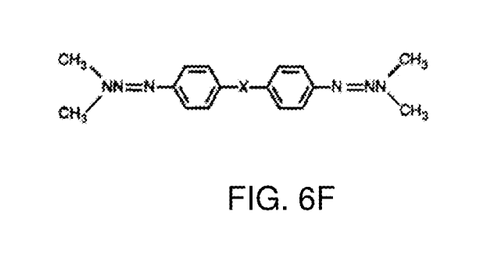

FIGS. 6A-6F provide examples of suitable cross-linkers. In various embodiments, the cross-linker contains at least one fluorine atom, which can make the FAP 230 more floatable. In an embodiment, the cross-linker may have the general structure shown in FIG. 6A, which includes a cross-linkable functional group in between the brackets. $R_1$ represents a hydrogen atom or an alkyl group having 1 to 20 carbon atom(s), and $R_2$ represents an alkyl group having 1 to 20 carbon atom(s), an alkenyl group having 2 to 8 carbon atoms, an alkynyl group having 2 to 12 carbon atoms, an alkylcarbonyl group having 2 to 12 carbon atoms, an alkylcarbonylamino group having 2 to 12 carbon atoms, an alkyloxyalkyl group having 2 to 12 carbon atoms, an alkylamino group having 1 to 12 carbon atom(s), an alkyldiamino group having 1 to 12 carbon atom(s) or any combination thereof. N is an integer from 1 to 200, and m is an integer from 2 to 10. The cross-linkable functional group can create a covalent bond with the FAP 230 backbone and form a linear or branched polymer structure. A specific example of a suitable cross-linker is shown in FIG. 6B, where the cross-linkable functional group is a glycidyl ether. M is an integer from 2 to 10. $R_2$ in FIG. 6B may be an alkyl group with a hydrogen attached to a hydrocarbon with a straight, branched, or cyclic structure. The alkyl group may also contain one or more hetero atoms. For example, it may further contain nitrogen or oxygen. The structure in FIG. 6B may be modified to float by including a fluorine atom or alkyl fluoride. For example, at least one the alkyl groups may include one or more of $CF_3$, $C_2F_5$, or $C_3F_7$. In various embodiments, the glycidyl ether group may be replaced by an alkyl oxide, alkene, alkyne, or other cross-linkable functional group, as shown in FIGS. 6C-6F, where X is O, $SO_2$, NH, or a linear or branched alkyl group having 1 to 20 carbon atom(s).

Figure 7:
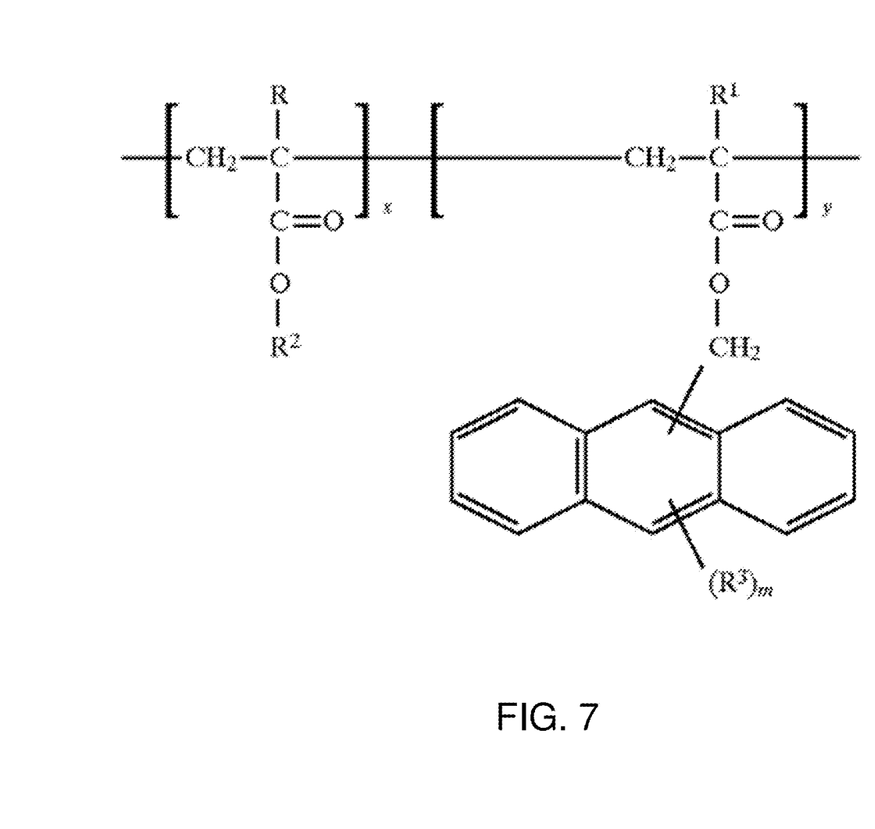
FIG. 7 illustrates an example of a polymer backbone of a FAP according to various aspects of the present disclosure.

FIG. 7 provides another example of a suitable polymer backbone for the FAP 230. In certain embodiments, the backbone of the FAP 230 itself can include at least one fluorine atom. As shown, the backbone includes a cross-linking functional group and a chromophore bound to the backbone. In various embodiments, the polymer backbone includes an acrylic, polyester, epoxy novolac, polysaccharide, polyether, polyimide, polyurethane, or mixtures thereof. Each R and $R^1$ are independently a hydrogen or a substituted or unsubstituted alkyl group having from 1 to 8 carbon atom(s); each $R^2$ is an independently substituted or unsubstituted alkyl group having 1 to 10 carbon atom(s) (e.g., 1 to 6 carbons); and each $R^3$ may be independently halogen (e.g., F, Cl, or Br), an alkyl group having 1 to 8 carbon atom(s), alkoxy group having 1 to 8 carbon atom(s), alkynyl group having 2 to about 8 carbon atom(s), cyano group, or nitro group. M is an integer from 0 to 9 (e.g., 0, 1, or 2); x is the mole fraction or percent of alkyl acrylate units in the polymer (e.g., about 10 to about 80 percent); and y is the mole fraction or percent of anthracene units in the polymer (e.g., about 5-10 to 90 percent). The structure can be modified to float by including a fluorine atom or alkyl fluoride. For example, at least one of the alkyl groups may include one or more of $CF_3$, $C_2F_5$, or $C_3F_7$.

Figure 8:
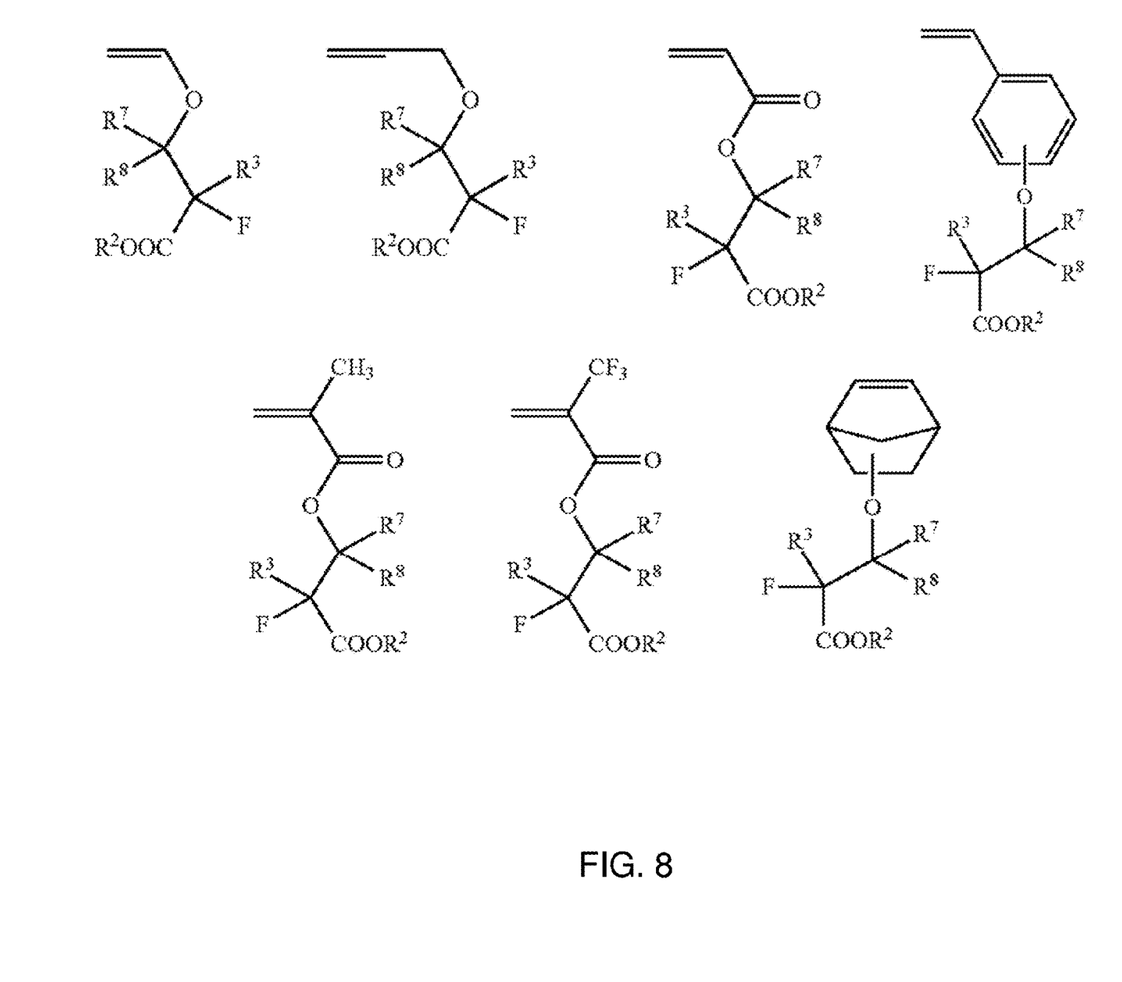
FIG. 8 illustrates examples of a polarity switchable group with an acid labile group (ALG) according to various aspects of the present disclosure.

FIG. 8 illustrates examples of suitable polarity switchable groups with an ALG. In various embodiments, the polarity switchable group with an ALG includes in fluorine and one or more aryl groups. The ALG can include a bulky unit with a tertiary carbon as a good leaving group In FIG. 8, $R^2$ represents an ALG, $R^3$ represents a fluorine atom or a fluorine-containing alkyl group, $R^7$ represents a hydrogen atom or a straight-chain, branched or cyclic alkyl or fluoroalkyl group, $R^8$ represents a straight-chain, branched or cyclic alkyl or fluoroalkyl group, and $R^7$ and $R^8$ may combined to form a ring.

Figure 9:
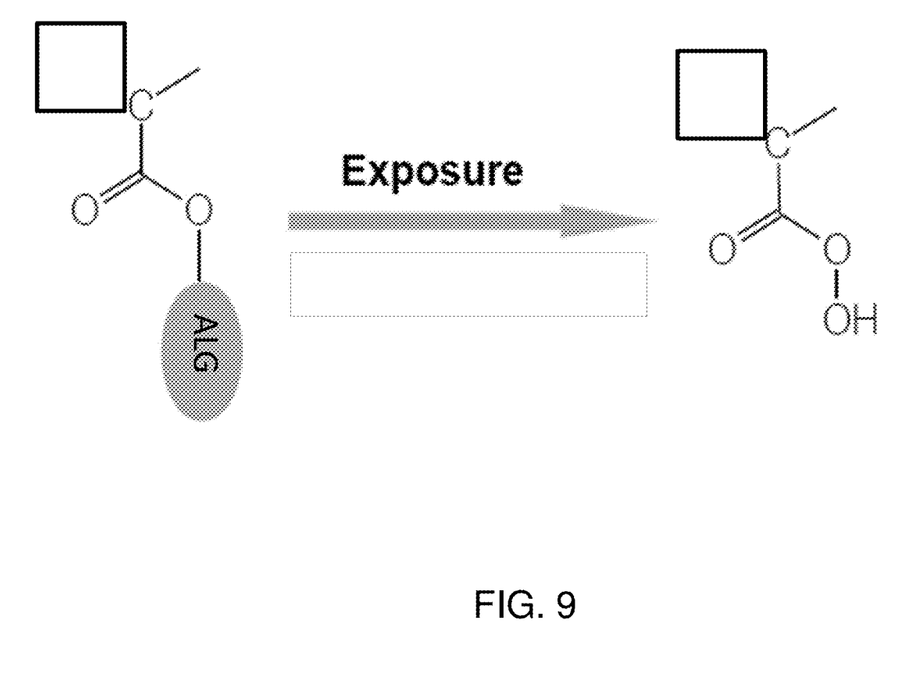
FIG. 9 illustrates an example of a polarity switchable group with an ALG and its conversion after exposure.

In certain embodiments, the polarity switchable group with the ALG can make the surface of the middle layer 220 more hydrophilic after exposure. FIG. 9 provides an example of a polarity switchable group with an ALG and illustrates its conversion into a compound with an acid group after exposure.

A photoresist layer 240 is formed on the middle layer 220 in step 106. For example, a spin-coating technique is utilized to form the photoresist layer 240 on the middle layer 220. The photoresist layer 240 is a positive-type or negative-type resist material and may have a multi-layer structure. The photoresist layer 240 may utilize a chemical amplification (CA) resist material. In one embodiment, a positive CA resist material includes a polymer material that turns soluble to a developer such as a base solution after the polymer is reacted with acid. Alternatively, the CA resist material can be negative and include a polymer material that turns insoluble to a developer such as a base solution after the polymer is reacted with acid. The photoresist layer 240 further includes a solvent filling inside the polymer. The solvent may be partially evaporated by a soft baking process.

In conventional trilayer film photolithography, the middle layer often has a porous structure. Because of this porous structure, small molecules such as PAGs can easily diffuse from the middle layer to the photoresist layer. This kind of chemical transfer often happens if the film density of the middle layer is not high enough. Due to the PAG diffusion into the photoresist layer, the PAG increase in the photoresist layer may cause a reduction in resist contrast.

In the present embodiment, the FAP 230 with the fluorine-containing material floats to the upper surface of the middle layer to form a dense, inner barrier that prevents diffusion of the PAG into the photoresist layer 240. This dense barrier prevents photoresist pattern peeling, decreases trench scum, and improves the photoresist profile. The resolution (contrast) of the resulting pattern is also improved. Features are clearer and more distinct. Moreover, because the PAG is chemically bound to the FAP 230, it remains on the surface of the middle layer 220.

After the photoresist layer 240 is formed, both the photoresist layer 240 and middle layer 220 are exposed to an exposure energy in step 108. In the exposing process step 108, the photoresist layer 240 and middle layer 220 are exposed to an exposure energy such as deep ultra-violet (DUV) through a photomask (mask or reticle) having a predefined pattern, resulting in a resist pattern that includes a plurality of exposed regions such as exposed features and a plurality of unexposed regions. In one embodiment, the exposure beam used to expose the photoresist layer 240 and middle layer 220 includes extreme ultraviolet (EUV) exposure and/or electron-beam (e-beam) writing. Alternatively, the exposure process may utilize other exposure beams, such as ion beam, x-ray, deep ultraviolet, and other proper exposure energy.

Without being bound by theory, the PAG bound to the FAP 230 and present in the middle layer 220 forms an acid during exposure. The acid reacts with the polarity switchable group with the ALG to yield a compound with an acid group. Areas of the middle layer 220 that are exposed to photoenergy produce small amounts of acid that are able to diffuse and react with the ALG in the FAP 230. The resulting middle layer 220 is more hydrophilic after exposure and decreases the contact angle of the middle layer 220. In turn, this causes the middle layer 220 to be more soluble in the developer solution, which improves trench scum and residue defects in the exposed areas.

To keep the resist contrast sharp, the diffusion of the acid generated by the PAG into the photoresist layer 240 should be minimized. The middle layer 220, however, should contain a sufficient loading of PAG that generates enough acid to cleave the ALG from the FAP 230. To solve this problem, the PAG is not blended into the middle layer 220, but is chemically bound to the FAP 230.

Advantageously, in this way, the acid generated in the middle layer 220 only deprotects the ALG and does not diffuse to the photoresist layer 240 to reduce resist contrast. Instead, the acid generated by the PAG is chemically bound to the FAP 230, which prevents the acid from traveling to the photoresist layer 240. Bonding between the acid and the FAP 230 may be in the form of a covalent bond, a hydrogen bond, or an ionic bond. For example, the acid can form an ion pair with a carboxylate anion, which is bound to the FAP 230. In various embodiments, the diffusion length of the acid is less than about 10 nm.

Subsequently, the photoresist layer 240 may be subjected to a post-exposure bake (PEB). The coated photoresist layer 240 may be baked, referred to as pre-baking process, to reduce the solvent.

The method proceeds to step 110, where the photoresist layer 240 is developed by any suitable process to form a pattern in the photoresist layer 240. A developing solution may be utilized to remove portions of the photoresist layer 240. An example of a developing solution is tetramethylammonium hydroxide (TMAH). Any concentration level of TMAH developer solution may be utilized, such as approximately 2.38% TMAH developer solution. The developing solution may remove the exposed or unexposed portions depending on the resist type. For example, if the photoresist layer 240 comprises a negative-type resist, the exposed portions are not dissolved by the developing solution and remain over substrate 45. If the photoresist layer 240 includes a positive-type resist, the exposed portions are dissolved by the developing solution, leaving the unexposed portions behind. The semiconductor device 200 may then be subjected to a rinsing process, such as a de-ionized (DI) water rinse. The rinsing process may remove residue particles.

The remaining exposed portions (or unexposed portions) in the photoresist layer 240 define a pattern. The pattern contains one or more openings or trenches, wherein portions of the underlying substrate 45 are exposed. Subsequent processing may include removing the exposed portions of the middle layer 220 and substrate 45 within the openings. The patterned photoresist may then be removed (or stripped) by any suitable process. For example, the patterned photoresist may be removed with a fluid (or stripping solution). The semiconductor device 200 may be subjected to one or more processes, such as additional patterning, etching, deposition, etc. processes, to form additional features of the semiconductor device 200. The middle layer 220 is eventually removed.

Various advantages may be present in one or more embodiments of the method 100 and the semiconductor device 200. The present disclosure provides a new material for a middle layer in a trilayer film scheme. The methods and material improve photoresist pattern peeling and trench scum by integrating different materials into the middle layer. Sharper pattern resolutions are obtained without the use of expensive machines or complex process steps.

One of the broader forms of the present disclosure relates to a method of making a semiconductor device. The method includes providing a substrate, forming a middle layer comprising a floating additive polymer (FAP) at an upper surface of the middle layer, the FAP chemically bound to a photoacid generator (PAG) and including a fluorine-containing material over the substrate, forming a photoresist layer over the middle layer, exposing the photoresist layer and the middle layer to an exposure energy to produce acid bound to the middle layer in the exposed areas of the middle layer, and developing the photoresist layer.

Another one of the broader forms of the present disclosure involves another method of making a semiconductor device. The method includes providing a substrate, forming a middle layer comprising a floating additive polymer (FAP) at an upper surface of the middle layer, the FAP chemically bound to a photoacid generator (PAG) and a polarity switchable group with an acid labile group (ALG), and including a fluorine-containing material over the substrate, forming a photoresist layer over the middle layer, exposing the photoresist layer and the middle layer to an exposure energy to produce acid bound to the middle layer in the exposed areas of the middle layer, and developing the photoresist layer.

The present disclosure also describes a material used in photolithography patterning. The material includes a polymer. The polymer includes a fluorine containing material and is chemically bound to a photoacid generator (PAG) and a polarity switchable group with an acid labile group (ALG). The polymer moves to an upper surface of the material when the material is coated over a substrate.

Other process steps may be implemented before, during and/or after the method 100. The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of making a semiconductor device, the method comprising:
   providing a substrate;
   forming a middle layer comprising a floating additive polymer (FAP) at an upper surface of the middle layer, the FAP chemically bound to a photoacid generator (PAG) and including a fluorine-containing material over the substrate;
   forming a photoresist layer over the middle layer;
   exposing the photoresist layer and the middle layer to an exposure energy to produce acid bound to the middle layer in the exposed areas of the middle layer, wherein the acid bonds to the FAP; and
   developing the photoresist layer.

2. The method of claim 1, wherein an upper surface of the middle layer contains a higher concentration of the FAP compared to lower portions of the middle layer.

3. The method of claim 1, wherein the PAG is selected from the group consisting of halogenated triazines, onium salts, diazonium salts, aromatic diazonium salts, phosphonium salts, sulfonium salts, iodonium salts, imide sulfonate, oxime sulfonate, diazodisulfone, disulfone, o-nitrobenzylsulfonate, sulfonated esters, halogenated sulfonyloxy dicarboximides, diazodisulfones, α-cyanooxyamine-sulfonates, imidesulfonates, ketodiazosulfones, sulfonyldiazoesters, 1,2-di(arylsulfonyl)hydrazines, nitrobenzyl esters, and s-triazine derivatives.

4. The method of claim 1, wherein the middle layer comprises less than about 30% of the FAP.

5. The method of claim 1, wherein the bonding between the acid and FAP comprises a covalent bond, hydrogen bond, or ionic bond.

6. The method of claim 1, wherein the diffusion length of the acid is less than about 10 nm.

7. The method of claim 1, wherein the photoresist layer includes a negative-type resist material.

8. The method of claim 1, wherein the photoresist layer includes a positive-type resist material.

9. The method of claim 1, wherein FAP comprises a cross-linker, a polarity switchable group, or both.

10. The method of claim 9, wherein the cross-linker, the polarity switchable group, or both are chemically bound to the FAP.

11. The method of claim 9, wherein the polarity switchable group comprises an acid functional group and an acid labile group (ALG).

12. A method of making a semiconductor device, the method comprising:
    providing a substrate;

forming a middle layer comprising a floating additive polymer (FAP) at an upper surface of the middle layer, the FAP chemically bound to a photoacid generator (PAG) and a polarity switchable group with an acid labile group (ALG), and including a fluorine-containing material over the substrate;

forming a photoresist layer over the middle layer;

exposing the photoresist layer and middle layer to an exposure energy to produce acid bound to the middle layer in the exposed areas of the middle layer, wherein the acid bonds to the FAP; and developing the photoresist layer.

13. The method of claim 12, wherein an upper surface of the middle layer contains a higher concentration of the FAP compared to lower portions of the middle layer.

14. The method of claim 12, wherein the PAG is selected from the group consisting of halogenated triazines, onium salts, diazonium salts, aromatic diazonium salts, phosphonium salts, sulfonium salts, iodonium salts, imide sulfonate, oxime sulfonate, diazodisulfone, disulfone, o-nitrobenzylsulfonate, sulfonated esters, halogenerated sulfonyloxy dicarboximides, diazodisulfones, α-cyanooxyamine-sulfonates, imidesulfonates, ketodiazosulfones, sulfonyldiazoesters, 1,2-di(arylsulfonyl)hydrazines, nitrobenzyl esters, and s-triazine derivatives.

15. The method of claim 12, wherein the middle layer comprises less than about 30% of the FAP.

16. A material utilized in photolithography patterning, comprising:

a floating additive polymer, wherein the floating additive polymer comprises:
 a polymer backbone;
 a fluorine containing material;
 a photoacid generator (PAG); and
 a polarity switchable group with an acid labile group (ALG), wherein the floating additive polymer moves to an upper surface of the material when the material is coated over a substrate, and wherein the material comprises less than about 30% of the floating additive polymer.

17. The material of claim 16, wherein the PAG is selected from the group consisting of halogenated triazines, onium salts, diazonium salts, aromatic diazonium salts, phosphonium salts, sulfonium salts, iodonium salts, imide sulfonate, oxime sulfonate, diazodisulfone, disulfone, o-nitrobenzylsulfonate, sulfonated esters, halogenerated sulfonyloxy dicarboximides, diazodisulfones, α-cyanooxyamine-sulfonates, imidesulfonates, ketodiazosulfones, sulfonyldiazoesters, 1,2-di(arylsulfonyl)hydrazines, nitrobenzyl esters, and s-triazine derivatives.

18. The material of claim 16, wherein the polarity switchable group with the ALG comprises an acid functional group.

19. The material of claim 16, wherein the fluorine-containing material is present in a cross-linker bound to the polymer backbone, the polymer backbone, or the polarity switchable group with the ALG.

20. The material of claim 19, wherein the cross-linker comprises:

wherein $R_1$ represents a hydrogen atom or an alkyl group having 1 to 20 carbon atom(s), $R_2$ represents an alkyl group having 1 to 20 carbon atom(s), an alkenyl group having 2 to 8 carbon atoms, an alkynyl group having 2 to 12 carbon atoms, an alkylcarbonyl group having 2 to 12 carbon atoms, an alkylcarbonylamino group having 2 to 12 carbon atoms, an alkyloxyalkyl group having 2 to 12 carbon atoms, an alkylamino group having 1 to 12 carbon atom(s), an alkyldiamino group having 1 to 12 carbon atom(s) or any combination thereof, n represents an integer between 1 to 200, and m represents an integer between 2 to 10.

* * * * *